United States Patent
Daun-Lindberg et al.

(10) Patent No.: US 6,344,768 B1
(45) Date of Patent: Feb. 5, 2002

(54) FULL-BRIDGE DC-TO-DC CONVERTER HAVING AN UNIPOLAR GATE DRIVE

(75) Inventors: Timothy Charles Daun-Lindberg; Michael Lee Miller, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/636,107

(22) Filed: Aug. 10, 2000

(51) Int. Cl.[7] ............................................... H03K 17/56
(52) U.S. Cl. ....................................... 327/424; 327/108
(58) Field of Search ................................. 327/108, 109, 327/110, 111, 112, 374, 377, 423, 424, 427

(56) References Cited

U.S. PATENT DOCUMENTS

| | | | | |
|---|---|---|---|---|
| 4,481,434 A | * | 11/1984 | Janutka | 307/570 |
| 4,500,801 A | * | 2/1985 | Janutka | 307/570 |
| 4,748,351 A | * | 5/1988 | Barzegar | 307/571 |
| 4,970,420 A | * | 11/1990 | Billings | 307/571 |
| 5,352,932 A | * | 10/1994 | Tihanyi | 307/248 |
| 5,404,059 A | * | 4/1995 | Loffler | 327/478 |
| 5,594,378 A | * | 1/1997 | Kruse et al. | 327/304 |
| 5,963,078 A | * | 10/1999 | Wallace | 327/432 |
| 6,271,708 B1 | * | 8/2001 | Hoshi et al. | 327/377 |

* cited by examiner

*Primary Examiner*—Jeffrey Zweizig
(74) *Attorney, Agent, or Firm*—Bracewell & Patterson

(57) ABSTRACT

A full-bridge DC-to-DC converter having an unipolar gate drive is disclosed. The full-bridge DC-to-DC converter includes a primary-to-secondary transformer, multiple gate drive circuits, and multiple gate drive transformers. The primary-to-secondary transformer converts a first DC voltage to a second DC voltage under the control of the gate drive circuits. Each of the gate drive circuits includes a first transistor and a second transistor. The gate of the first transistor is connected to a pulse voltage source via a diode. The drain of the second transistor is connected to the source of the first transistor, and the source of the second transistor is connected to the gate of the first transistor via a resistor, for discharging a gate-to-source voltage of the first transistor during the time when a voltage of the pulse voltage source is below a gate-to-source threshold voltage of the first transistor. Coupled to at least two of the gate drive circuits, each of the gate drive transformers controls at least two gate drive circuits.

12 Claims, 5 Drawing Sheets

FULL-BRIDGE DC-TO-DC CONVERTER HAVING AN UNIPOLAR GATE DRIVE

BACKGROUND OF THE INVENTION

1. Technical Field

The present invention relates to DC-to-DC converters in general, and in particular to full-bridge DC-to-DC converters. Still more particularly, the present invention relates to a full-bridge DC-to-DC converter having an unipolar gate drive.

2. Description of the Prior Art

A direct current (DC) voltage can be converted to another DC voltage via a DC-to-DC converter. The basic topology of a DC-to-DC converter may take a variety of forms, such as a full-bridge inverter, a half-bridge inverter, a buck converter, a boost converter, or a flyback converter. Each topology is better suited for a specific type of application. For example, a boost converter topology is typically used when the desired output DC voltage needs to be greater than the input voltage, while a buck converter topology is typically used when the output voltage needs to be less than the input voltage. Generally, for low-power applications, i.e., below 50 watts, the buck, boost, or flyback converter topologies are more preferable, while for high-power applications, i e., above 50 watts, the half-bridge or full-bridge inverters topologies are more preferable.

Referring now to the drawings and in particular to FIG. 1, there is depicted a circuit diagram of a full-bridge DC-to-DC converter according to the prior art. As shown, a DC-to-DC converter 10 converts an input voltage +Vd (relative to a ground voltage of 0 V) at DC input terminals 11 to a desired output voltage at DC output terminals 12 intended for supplying to a load (not shown). control circuit (not shown) supplies pulsed control signals G1 to G4 to switching transistors 51–54 for maintaining the output voltage at its desired level using phase shift control in a well-known manner. The pulsed control signals G1 and G2 are generally complementary to one another at a desired switching frequency, and the pulsed control signals G3 and G4 are relatively variably phase shifted from the pulsed control signals G1 and G2 to provide the phase shift control. The switching frequency is typically desired to be high to permit DC-to-DC converter 10 to be implemented using components of relatively small size.

DC-to-DC converter 10 also includes a transformer 14 having a primary winding 16 and a center tapped secondary winding 18, the senses of which are represented conventionally in FIG. 1 by dots adjacent to the windings. The center tap of secondary winding 18 is connected to ground, and the outer ends of secondary winding 18 are connected to output terminals 12 via respective diodes 55, 56 and an output filter. The output filter is an LC filter comprising a series output inductor 15 and a shunt output capacitor 19.

Primary winding 16 is connected in series with an inductor 17 between the junction points of two switching legs, referred to as leg A and leg B, of a full bridge arrangement of switching transistors 51 to 54 controlled by the control signals G1 to G4, respectively. Each of switching transistors 51–54 is constituted by the drain-source path of an n-channel MOSFET, which is illustrated with its parasitic or body diode connected in parallel with the drain-source path, to the gate of which the respective control signal is supplied. Snubber capacitors 61 to 64 are connected in parallel with the drain-source paths of switching transistors 51 to 54. Switching leg A comprises switching transistors 51 and 52 connected in series between DC supply terminals 11, and switching leg B comprises switching transistors 53 and 54 connected in series between DC supply terminals 11, with the drains of the MOSFETs constituting switching transistors 51 and 53 being connected to the +Vd terminal and the sources of the MOSFETs constituting switching transistors 52 and 54 being connected to the ground terminal.

Snubber capacitors 61 to 64 are intended, in conjunction with inductor 17, to provide for zero voltage switching (ZVS) to switching transistors 51–54. In other words, each snubber capacitor is intended to be fully discharged at each switching time of the respective switching transistor, so that switching power losses are reduced. While this can be relatively closely approximated for the maximum or full-load, connected to output terminals 12, for which DC-to-DC converter 10 is designed, at reduced and/or zero loads the snubber capacitors are not fully discharged at the turn-on times of the respective switches, and remaining energy stored in the snubber capacitors is dissipated in switching transistors 51–54 at turn-on. This results in increased switching losses with reduced loads, lower efficiency, and higher electromagnetic influence (EMI). In addition, the provision of inductor 17 in series with primary winding 16 results in an overlap in conduction of diodes 55 and 56, and consequently reduces the power transfer from input terminals 11 to output terminals 12. As a result, the effective duty cycle of DC-to-DC converter 10 is reduced.

Consequently, it would be desirable to provide an improved full-bridge DC-to-DC converter with more effective duty cycles.

SUMMARY OF THE INVENTION

In accordance with a preferred embodiment of the present invention, a DC-to-DC converter includes a primary-to-secondary transformer, multiple gate drive circuits, and multiple gate drive transformers. The primary-to-secondary transformer converts a first DC voltage to a second DC voltage under the control of the gate drive circuits. Each of the gate drive circuits includes a first transistor and a second transistor. The gate of the first transistor is connected to a pulse voltage source via a diode. The drain of the second transistor is connected to the source of the first transistor, and the source of the second transistor is connected to the gate of the first transistor via a resistor, for discharging a gate-to-source voltage of the first transistor during the time when a voltage of the pulse voltage source is below a gate-to-source threshold voltage of the first transistor. Coupled to at least two of the gate drive circuits, each of the gate drive transformers controls at least two gate drive circuits.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
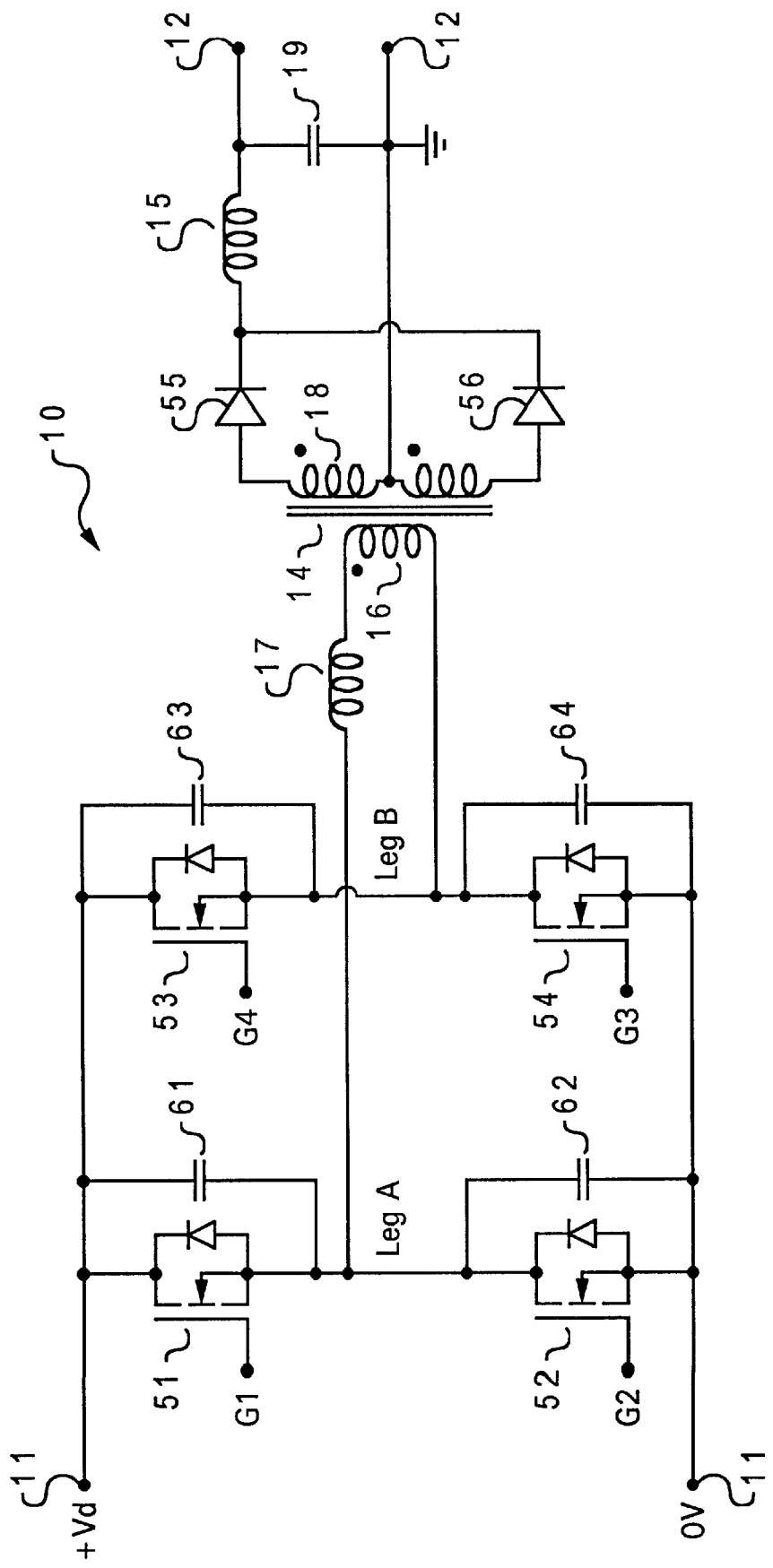
FIG. 1 is a circuit diagram of a full-bridge DC-to-DC converter according to the prior art.
Figure 2:
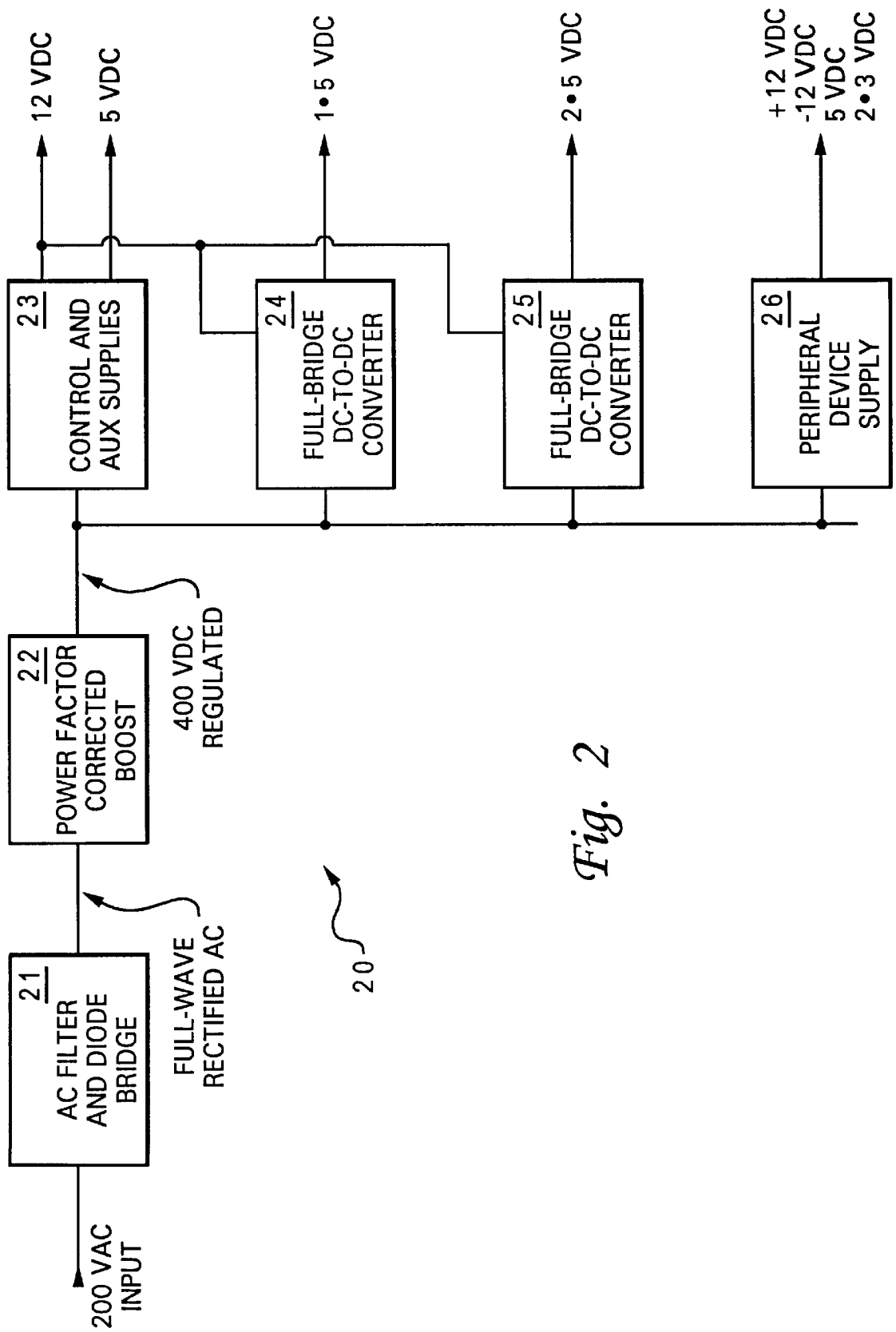
FIG. 2 is a block diagram of a computer power supply in which a preferred embodiment of the present invention is incorporated.

With reference now to FIG. 2, there is illustrated a block diagram of a computer power supply in which a preferred embodiment of the present invention is incorporated. As shown, a computer power supply 20 includes an alternate current (AC) filter and diode bridge 21 to convert a, for example, 200 VAC input to a full-wave rectified AC. A power factor corrected (PFC) boost 22 then converts the full-wave rectified AC to a, for example, 400 V regulated direct current (DC). The regulated 400 VDC is then distributed to various power supplies and regulators, as needed. In FIG. 2, the regulated 400 VDC is distributed to control and auxiliary supplies 23 for providing a 12 VAC and a 5 VDC, to a full-bridge DC-to-DC converter 24 for providing a 1.5 VDC, to a full-bridge DC-to-DC converter 25 for providing a 2.5 VDC, and to a peripheral M device supply 26 for providing a ±12 VDC, a 5 VDC, and a 3.3 VDC.

Figure 3:
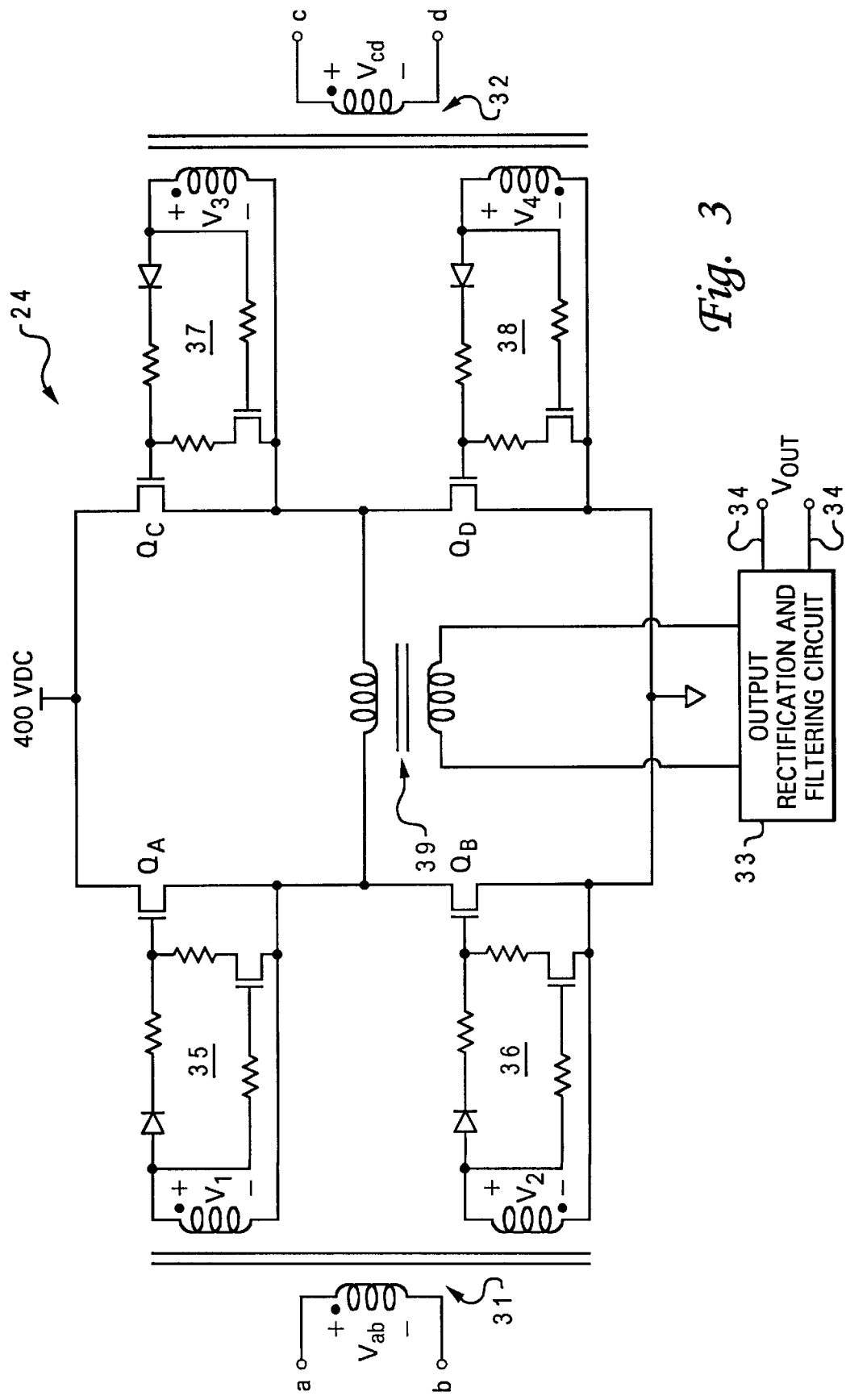
FIG. 3 is a circuit diagram of a full-bridge DC-to-DC converter utilized within the computer power supply from FIG. 2, in accordance with a preferred embodiment of the present invention.

Referring now to FIG. 3, there is illustrated a circuit diagram of a full-bridge DC-to-DC converter, such as full-bridge DC-to-DC converter 24, within computer power supply 20 from FIG. 2, in accordance with a preferred embodiment of the present invention. As shown, full-bridge DC-to-DC converter 24 includes two gate drive transformers 31–32, four gate drive circuits 35–38, a primary-to-secondary transformer 39, and an output rectification and filter circuit 33. Gate drive transformer 31 converts a pulse voltage $V_{ab}$ at inputs a, b to a pulse DC voltage $V_1$ for gate drive circuit 35. Gate drive transformer 31 also converts a pulse voltage $V_{ab}$ at inputs a, b to a pulse DC voltage $V_2$ for gate drive circuit 36 with complementary phasing from gate drive circuit 35. On the other hand, gate drive transformer 32 converts a pulse DC voltage $V_{cd}$ at inputs C, d to a pulse DC voltage $V_3$ for gate drive circuit 37. Gate drive transformer 32 also converts a pulse DC voltage $V_{ab}$ at inputs a, b to a pulse DC voltage $V_4$ for gate drive circuit 38 with complementary phasing from gate drive circuit 37. The voltages at inputs a, b and c, d are produced by a pulse width modulator (PWM) controller (not shown) that is well-known in the art.

Gate drive circuit 35 and gate drive circuit 36 operate in a complementary fashion. For example, pulse DC voltage $V_2$ in gate drive circuit 36 is positive when pulse DC voltage $V_1$ in gate drive circuit 35 is negative. Similarly, gate drive circuit 37 and gate drive circuit 38 operate in a complementary fashion. For example, pulse DC voltage $V_4$ in gate drive circuit 38 is positive when pulse DC voltage $V_3$ in gate drive circuit 37 is negative. Under the control of gate drive circuits 35–38, primary-to-secondary transformer 39 converts the 400 VDC to a second DC voltage, e.g., 1.5 V, for a rectification and filter circuit 33. Output rectification and filter circuit 33 then rectifies and filters the second DC voltage from primary-to-secondary transformer 39, and generates a "smoother" second DC voltage at a DC output 34.

Figure 4:
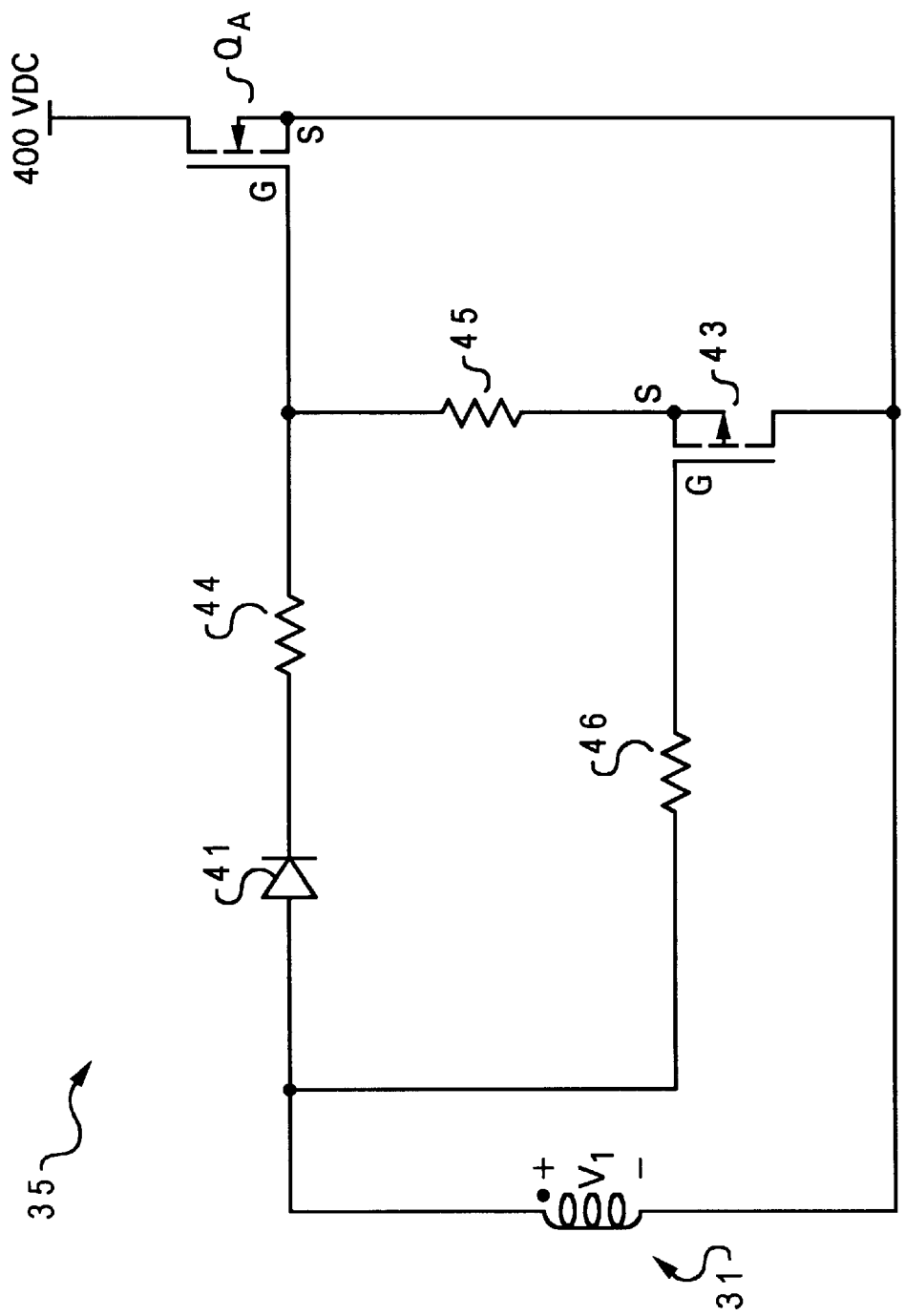
FIG. 4 is a circuit diagram of a gate drive circuit in accordance with a preferred embodiment of the present invention.

Because gate drive circuits 35–38 are identical to each other, thus, only gate drive circuit 35 will be described in detail. With reference now to FIG. 4, there is illustrated a circuit diagram of gate drive circuit 35 in accordance with a preferred embodiment of the present invention. As shown, gate drive circuit 35 includes a diode 41, an n-channel MOSFET $Q_A$, a p-channel MOSFET 43, and resistors 44–46. The source-to-gate threshold voltage ($V_{sg}$) of MOSFET 43 is preferably lower than the gate-to-source voltage ($V_{gs}$) of MOSFET $Q_A$. In this embodiment, the source-to-gate threshold voltage of MOSFET 43 is approximately 1 V and the gate-to-source threshold voltage of MOSFET $Q_A$ is approximately 2–4 V. Thus, MOSFET 43 can be turned on faster (at a lower voltage) than MOSFET $Q_A$, by pulse DC voltage $V_1$.

Gate drive circuit 35 operates as follows. When pulse DC voltage $V_1$ is positive, current flows from gate drive transformer 31 to diode 41, to resistor 44, and to MOSFET $Q_A$; thus, MOSFET $Q_A$ is turned on and MOSFET 43 is turned off. When pulse DC voltage $V_1$ is negative, current flows from MOSFET 43 to resistor 46; thus, MOSFET 43 is turned on and MOSFET $Q_A$ is turned off. As a result, when pulse DC voltage $V_1$ is positive, MOSFET $Q_A$ is turned on and 400 VDC is applied to primary-to-secondary transformer 39 (from FIG. 3) via MOSFET $Q_A$. When pulse DC voltage $V_1$ is negative, MOSFET 43 is turned on to discharge the gate-to-source voltage in MOSFET $Q_A$. The above-mentioned discharging function by MOSFET 43 continues until pulse DC voltage $V_1$ rises above the gate-to-source threshold voltage of MOSFET $Q_A$ again.

Figure 5:
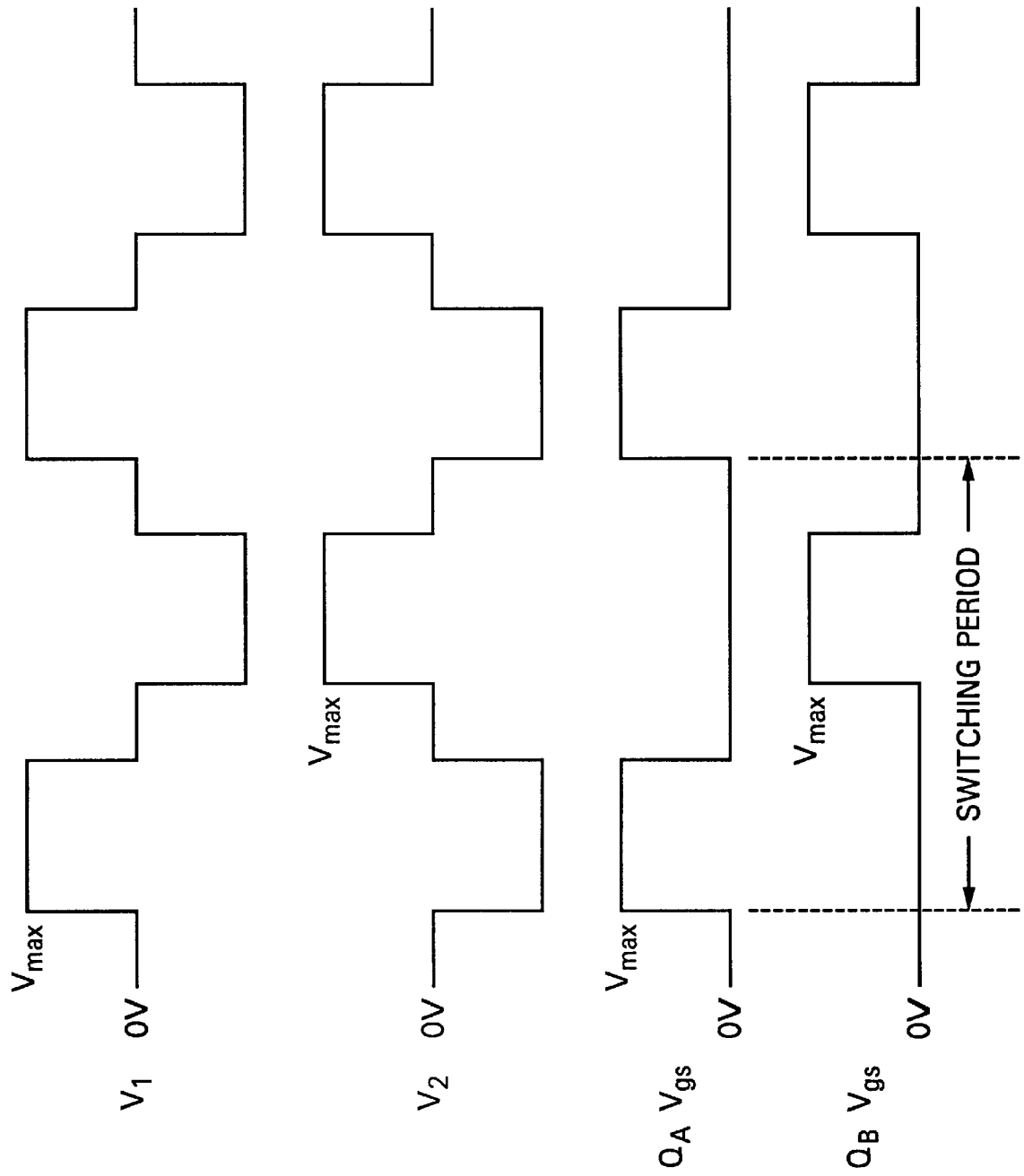
FIG. 5 illustrates several waveforms for two gate drive circuits from the full-bridge DC-to-DC converter of FIG. 3, in accordance with a preferred embodiment of the present invention.

Referring now to FIG. 5, there is illustrated several waveforms for gate drive circuits 35 and 36, in accordance with a preferred embodiment of the present invention. As shown, when pulse DC voltage $V_1$ is at $V_{max}$, $V_{gs}$ of transistor $Q_A$ from gate drive circuit 35 is at $V_{max}$ while $V_{gs}$ of transistor $Q_B$ from gate drive circuit 36 is at zero. When pulse DC voltage $V_2$ is at $V_{max}$, $V_{gs}$ of transistor $Q_B$ from gate drive circuit 36 is at $V_{max}$ while $V_{gs}$ of transistor $Q_A$ from gate drive circuit 35 is at zero. The $V_{gs}$ of transistor $Q_A$ and the $V_{gs}$ of transistor $Q_B$ reach $V_{max}$ within a single switching period (or switching cycle). The $V_{gs}$ of transistor $Q_C$ and the $V_{gs}$ of transistor $Q_D$ operate in a similar manner to those of transistors $Q_A$ and $Q_B$, respectively, but are time-shifted.

As has been described, the present invention provides an improved full-bridge DC-to-DC converter having an unipolar gate drive circuit. Since the pulse voltage "seen" by the gate of transistor $Q_A$ (or $Q_B$) in the gate drive circuit of the present invention is reduced by one half as compared to a similar transistor in a prior art gate drive circuit; thus, the power dissipation of the gate drive circuit of the present invention is reduced by ¼ over the prior art. The drive technique of the present invention is applicable to any topology having a bipolar gate drive circuit. For example, the present invention is applicable to a half-bridge DC-to-DC converter having a bipolar gate drive circuit.

While the invention has been particularly shown and described with reference to a preferred embodiment, it will be understood by those skilled in the art that various changes in form and detail may be made therein without departing from the spirit and scope of the invention.

What is claimed is:

1. A gate drive circuit comprising:
   a first transistor having a gate connected to a pulse voltage source via a diode, wherein said first transistor is an n-channel MOSFET;
   a second transistor having a drain connected to a source of said first transistor, and having a source connected to said gate of said first transistor via a first resistor, for discharging a gate-to-source voltage of said first transistor during the time when a voltage of said pulse voltage source is below a gate-to-source threshold voltage of said first transistor, wherein said second transistor is a p-channel MOSFET.

2. The gate drive circuit according to claim 1, wherein said gate of said first transistor is connected to said pulse voltage source via said diode and a second resistor connected in series.

3. The gate drive circuit according to claim 1, wherein a gate of said second transistor is connected to said pulse voltage source via a third resistor.

4. The gate drive circuit according to claim 1, wherein said pulse voltage source is a pulse voltage DC source generated by a gate drive transformer.

5. The gate drive circuit according to claim 1, wherein a source-to-gate threshold voltage of said second transistor is preferably lower than said gate-to-source voltage of said first transistor.

6. A DC-to-DC converter comprising:

a primary-to-secondary transformer for converting a first DC voltage to a second DC voltage;

a plurality of gate drive circuits, coupled to said primary-to-secondary transformer, for controlling said primary-to-secondary transformer, wherein each of said plurality gate drive circuits includes a first transistor having a gate connected to a pulse voltage source via a diode;

a second transistor having a drain connected to a source of said first transistor, and having a source connected to said gate of said first transistor via a first resistor, for discharging a gate-to-source voltage of said first transistor during the time when a voltage of said pulse voltage source is below a gate-to-source threshold voltage of said first transistor; and a plurality of gate drive transformers, each coupled to at least two of said plurality of gate drive circuits, for controlling said plurality of gate drive circuits.

7. The DC-to-DC converter according to claim 6, wherein said gate of said first transistor is connected to said pulse voltage source via said diode and a second resistor connected in series.

8. The DC-to-DC converter according to claim 6, wherein a gate of said second transistor is connected to said pulse voltage source via a third resistor.

9. The DC-to-DC converter according to claim 6, wherein said first transistor is an n-channel MOSFET and said second transistor is a p-channel MOSFET.

10. The DC-to-DC converter according to claim 6, wherein said pulse voltage source is a pulse voltage DC source generated by a gate drive transformer.

11. The DC-to-DC converter according to claim 6, wherein a source-to-gate threshold voltage of said second transistor is preferably lower than said gate-to-source voltage of said first transistor.

12. The DC-to-DC converter according to claim 6, wherein said DC-to-DC converter further includes an output rectification and filtering circuit coupled to said primary-to-second transformer.

* * * * *